United States Patent
Ajmera et al.

(10) Patent No.: US 6,566,210 B2
(45) Date of Patent: May 20, 2003

(54) METHOD OF IMPROVING GATE ACTIVATION BY EMPLOYING ATOMIC OXYGEN ENHANCED OXIDATION

(75) Inventors: Atul C. Ajmera, Wappingers Falls, NY (US); Omer H. Dokumaci, Wappingers Falls, NY (US); Bruce B. Doris, Brewster, NY (US); Oleg Gluschenkov, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/905,233

(22) Filed: Jul. 13, 2001

(65) Prior Publication Data

US 2003/0010972 A1 Jan. 16, 2003

(51) Int. Cl.[7] ............................................. H01L 21/336
(52) U.S. Cl. ..................... 438/303; 438/305; 438/306; 257/344
(58) Field of Search ................................. 438/303, 305, 438/306, 532; 257/327, 344

(56) References Cited

U.S. PATENT DOCUMENTS 5,998,289 A  * 12/1999 Sagnes ...................... 257/407
6,219,299 B1 *  4/2001 Forbes et al. ............... 257/302

* cited by examiner

Primary Examiner—Trung Dang
(74) Attorney, Agent, or Firm—Scully, Scott, Murphy & Presser; Marian Underweiser

(57) ABSTRACT

The present invention provides a method of preparing a Si-based metal-insulator-semiconductor (MIS) transistor which prevents the polycrystalline grains of the gate conductor from getting significantly larger by reducing the thermal budget of the sidewall oxidation process. The thermal budget of the inventive sidewall oxidation process is reduced one or two orders of magnitude over conventional prior art sidewall oxidation processes by utilizing atomic oxygen as the oxidizing ambient. The present invention also provides Si-based MIS transistors having a gate conductor having grain sizes of about 0.1, preferably 0.05, $\mu$m or less.

20 Claims, 2 Drawing Sheets

METHOD OF IMPROVING GATE ACTIVATION BY EMPLOYING ATOMIC OXYGEN ENHANCED OXIDATION

FIELD OF THE INVENTION

The present invention relates to semiconductor device fabrication, and more particularly to a method of fabricating Si-based metal-insulator-semiconductor (MIS) transistors comprising at least a Si-containing semiconductor polycrystalline gate conductor, e.g., polysilicon, SiGe, or SiGeC, wherein the gate conductor has grain sizes of about 0.1 µm or less.

BACKGROUND OF THE INVENTION

Modern Si-based metal-insulator-semiconductor (MIS) field effect transistors (FETs) containing polysilicon gate conductors are typically fabricated with the use of socalled sidewall or corner oxidation of the gate corner. Sidewall oxidation processes are routinely employed in conventional process flows such as complementary metal oxide semiconductor (CMOS) logic, static random access memory (SRAM), dynamic random access memory (DRAM), embedded DRAM, flash memories and other like processing flows.

As is known to those skilled in the art, sidewall oxidation of the gate corners thickens the gate insulator at the gate corner. Thick corner insulators prevent electrical breakdown at the device corners. The corner insulator also reduces the electric field by effectively rounding the corner during oxidation. A higher corner electric field can produce large hot-carrier effects leading to poor transistor reliability. In addition, the planar oxide grown during corner oxidation is used as a screen oxide for a subsequent ion-implantation step, thus, simplifying process integration flow. All these benefits of sidewall (or corner) oxidation are well known in the art; therefore a detailed discussion concerning the same is not needed herein.

As also known to those skilled in the art, semiconductor devices comprising polysilicon gate conductors having small grain sizes (on the order of about 0.05 µm or less) are preferred over devices wherein the polysilicon gate conductors have large grain sizes. This is because; devices containing polysilicon having small grain sizes have the following benefits associated therewith:

(1) Dopant diffusion from the implanted area to the polysilicon/gate dielectric interface will be faster because the density of the grain boundaries is higher; the concentration of the dopants will be higher at the interface and this will improve gate activation.

(2) There will be at least one vertical grain boundary path for small gates (less than 0.05–0.1 µm). With large grains, there is the possibility that no grain boundary paths exist between the top and the bottom of the gate. This can prevent dopants reaching the bottom interface and can cause severe poly depletion problems in small devices.

(3) Dopants have to diffuse shorter distances within the grains to completely dope the interior of the grains. This can increase the activation in the polysilicon gate conductor since dopants are only active inside the grains.

To reap all of the above-mentioned benefits, the grain size should be kept as small as possible until the dopants are implanted into the gate. However, in current technologies, sidewall oxidation is generally performed before the implantation of the dopants into the gate. Sidewall oxidation usually has a high thermal budget associated therewith. Due to the high thermal budget, grain size can increase significantly during the sidewall oxidation process.

In order to prevent the above from occurring, the sidewall oxidation thermal budget needs to be reduced. To date, the inventors are unaware of any prior art process that sufficiently addresses the above-mentioned problems. Hence, there is a continued need for developing a new and improved method for fabricating Si-based MIS transistors comprising polysilicon or other Si-containing semiconductor polycrystalline gate conductors having small grain sizes associated therewith in which the method significantly reduces the thermal budget of the sidewall oxidation process.

SUMMARY OF THE INVENTION

One object of the present invention relates to a method of fabricating a Si-based MIS transistor comprising a Si-containing semiconductor polycrystalline gate conductor having small grain sizes associated therewith. The term "small grain sizes" as used herein denotes grains whose size is about 0.1, preferably 0.05, µm or less. The term "Si-containing semiconductor polycrystalline gate conductor" includes polysilicon, SiGe, SiGeC, Si/SiGe and other like materials.

A further object of the present invention is to provide a method of fabricating a Si-based MIS transistor in which the thermal budget of the sidewall oxidation process is significantly reduced so as to maintain the small grain sizes within the gate conductor.

A yet further object of the present invention is to provide a method of fabricating a Sibased MIS transistor which minimizes the poly depletion effects that are typically observed in prior art Si-based MIS transistors.

An even further object of the present invention is to provide a method of fabricating a Si-based MIS transistor which prevents the grains of the gate conductor from getting larger by reducing the thermal budget of the sidewall oxidation process utilizing a process which is easy to implement with existing technologies.

These and other objects and advantages are achieved in the present invention by utilizing atomic oxygen as the oxidative ambient during the sidewall gate oxidation step. The use of atomic oxygen during sidewall oxidation has unexpectedly reduced the thermal budget of the oxidation process by a factor of one or two orders of magnitude as compared with typical thermal budgets obtained by prior art sidewall oxidations. The lowering of the thermal budget of the sidewall oxidation process results in the formation of a Si-based MIS transistor comprising a Si-containing semiconductor polycrystalline gate conductor whose grain sizes are about 0.1, preferably 0.05, µm or less.

Specifically, the method of the present invention comprises the steps of:

(a) forming a structure comprising a patterned Si-containing semiconductor polycrystalline region with grains of less than about 0.1 µm a surface of a gate dielectric, said gate dielectric being formed on a surface of a Si-containing substrate;

(b) subjecting said structure to a sidewall oxidation process in which atomic oxygen is employed so as to oxidize a portion of said Si-containing semiconductor polycrystalline region;

(c) implanting dopant ions into said Si-containing substrate and said Si-containing semiconductor polycrystalline region; and (d) activating said dopant ions.

Another aspect of the present invention relates to a Si-based MIS transistor which is formed by the above-mentioned method. Specifically, the inventive Si-based MIS transistor comprises:

a Si-containing substrate;

a gate dielectric formed on a surface of said Si-containing substrate;

a patterned region of doped Si-containing semiconductor polycrystalline material formed on a surface of said gate dielectric, wherein said region of doped Si-containing polycrystalline material has grain sizes of about 0.1 μm or less;

a layer of thermal oxide formed on at least sidewalls of said patterned region of doped Si-containing semiconductor polycrystalline material; and diffusion regions formed in said Si-containing substrate about said patterned region of Si-containing semiconductor polycrystalline material, wherein said diffusion regions are in electrical contact with each other via a channel region.

DETAILED DESCRIPTION OF THE PRESENT INVENTION

Figure 1A:
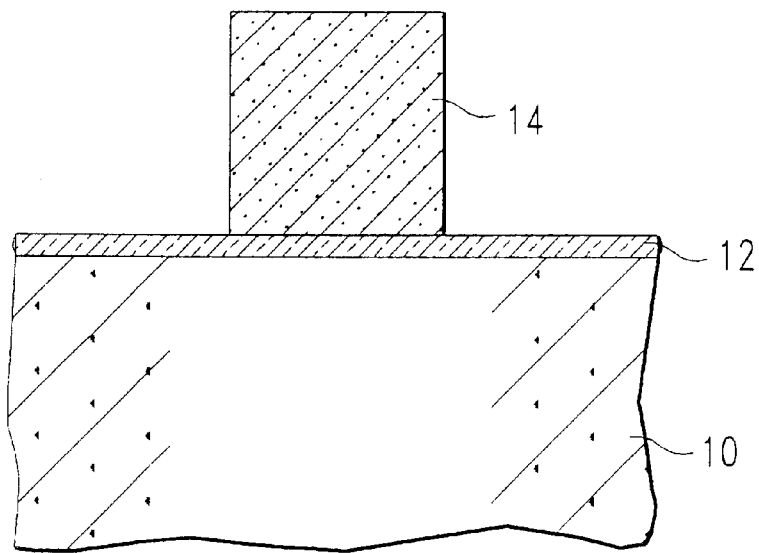
FIGS 1A–1D are pictorial representations (through cross-sectional views) illustrating the processing steps employed in the present invention for fabricating a transistor having a doped Si-containing semiconductor polycrystalline gate conductor which has small grain sizes associated therewith.

The present invention, which provides a method for preventing the polycrystalline grains of a Si-containing gate conductor from getting larger, by reducing the thermal budget of the sidewall oxidation process, will now be described in more detail by referring to the drawings that accompany the present invention. It is noted that in the accompanying drawings like and/or corresponding elements are referred to by like reference numerals.

Reference is first made to FIG. 1A which illustrates an initial structure that can be employed in the present invention. Specifically, the initial structure shown in FIG. 1A comprises Si-containing substrate 10, gate dielectric 12, and patterned region of Si-containing semiconductor polycrystalline material 14. Although only one patterned region of Si-containing semiconductor polycrystalline material is shown in the drawings, the present invention works equally well when more than one patterned region of Si-containing semiconductor polycrystalline material is present on the gate dielectric. The region of patterned Si-containing semiconductor crystalline material has small grain sizes (on the order of about 0.1, preferably 0.05, μm or less) associated therewith.

The transistor structure shown in FIG. 1A includes conventional materials that are well known in the art and the structure is fabricated using conventional processing steps that are also well known in the art. For example, Si-containing substrate 10 comprises any Si-containing semiconducting material including, but not limited to: Si, SiGe, SiGeC, SiC and other like Si-containing semiconductors. Layered semiconductors such as Si/Si, Si/SiGe and silicon-on-insulators (SOIs) may also be employed in the present invention as Si-containing substrate 10. Si-containing substrate 10 may be undoped, or alternatively the substrate may be doped with an n-or p-type dopant ion.

The substrate may contain various isolation regions such as shallow trench isolation (STI) or local oxidation of silicon (LOCOS) isolation regions formed in the surface thereof. Additionally, the substrate may include well regions, buried diffusion regions and other like regions. For clarity, the drawings of the present invention do not specifically show the presence of any of the above-mentioned regions; however, reference numeral 10 is meant to include those regions. One highly preferred Si-containing substrate employed in the present invention is a substrate that is comprised of Si.

Gate dielectric (or gate insulator) 12 is then formed on a surface of substrate 10 utilizing a conventional deposition process such as chemical vapor deposition (CVD), plasma-assisted CVD, evaporation, sputtering, atomic layer chemical vapor deposition (ALCVD), molecular beam epitaxy (MBE) and chemical solution deposition. Alternatively, the gate dielectric may be formed by a thermal oxidation, nitridation or oxynitridation process.

Gate dielectric 12 is comprised of a dielectric material including, but not limited to: oxides, nitrides, oxynitrides and mixtures or multilayers thereof. A highly preferred dielectric material that is employed in the present invention as gate dielectric 12 is $SiO_2$. Note that the dielectrics employed in the present invention may have a higher or lower dielectric constant, k, than $SiO_2$.

The physical thickness of gate dielectric 12 may vary, but typically the gate dielectric has a thickness of from about 0.4 to about 20 nm, with a thickness of from about 0.5 to about 10 nm being more highly preferred.

After forming the gate dielectric on a surface of the substrate, a patterned region of Si-containing semiconductor polycrystalline material (labeled as 14 in FIG. 1A) is formed by first applying a layer of Si-containing semiconductor polycrystalline material onto the gate dielectric and thereafter patterning the layer of Si-containing semiconductor polycrystalline material via conventional lithography and etching. Note that patterned region 14 serves as the gate conductor of the resultant transistor that is formed in the present invention.

Specifically, a layer of Si-containing semiconductor polycrystalline material is first formed on a surface of gate dielectric 12 utilizing a conventional deposition process such as CVD, plasma-assisted CVD, sputtering, evaporation, and chemical solution deposition. Alternatively, the layer of Si-containing semiconductor polycrystalline material may be formed by an epitaxial growth process. Note that the layer of Si-containing semiconductor polycrystalline material has small grain sizes (about 0.1 μm or less) associated therewith.

The physical thickness of layer of Si-containing semiconductor polycrystalline material formed in the present invention may vary depending on the process used in forming the same. Typically, however, the layer of Si-containing semiconductor polycrystalline material employed in the present invention has a thickness of from about 10 to about 300 nm, with a thickness of from about 20 to about 200 nm being more highly preferred.

Suitable Si-containing semiconductor polycrystalline material that can be employed in the present invention include, but are not limited to: polysilicon, SiGe, SiC, SiGeC, Si/SiGe and other like materials which include a Si-containing semiconductor and have polycrystalline grains. Of these materials, it is preferred to employ polysilicon as the Si-containing semiconductor polycrystalline material.

Optionally, a dielectric cap, not shown in the drawings, may be formed on the layer of Si-containing semiconductor polycrystalline material prior to patterning. When such an embodiment is employed, the dielectric cap includes any conventional hardmask material such as an oxide, nitride, oxynitride and combinations or multilayers thereof which is applied using conventional processes well known in the art. For example, the dielectric cap may be applied by utilizing a conventional deposition process such as CVD, plasma-assisted CVD, evaporation, chemical solution deposition and other like deposition processes. Alternatively, a conventional thermal growing process may be employed in forming the dielectric cap. It is again emphasized that the dielectric cap is optional and need not be employed in the present invention.

In applications when a dielectric cap is present on the gate conductor, a layer of photoresist (not shown) is then formed on the dielectric cap and that structure is subjected to conventional lithography which includes exposing the layer of photoresist to a pattern of radiation, developing the pattern by utilizing an appropriate developer solution, and transferring the pattern to the underlying dielectric cap via a conventional dry etching process such as reactive-ion etching. The patterned dielectric cap is used in defining the channel length of the gate region of the resultant structure.

Note that when no dielectric cap is present on the gate conductor, as is the case shown in the drawings, a patterned resist (not shown) is formed on the layer of Si-containing semiconductor polycrystalline material by using conventional lithography which includes the steps of applying a photoresist to the layer of Si-containing semiconductor polycrystalline material, exposing the photoresist to a pattern of radiation and developing the pattern.

Following formation of the patterned resist, exposed portions of the layer of Si-containing semiconductor polycrystalline material, not protected by the patterned resist, are removed stopping on gate dielectric 12 so as to provide the structure shown in FIG. 1A. In accordance with this step of the present invention, the exposed portions of Si-containing semiconductor polycrystalline material are removed utilizing an anisotropic etching process that is highly selective in removing Si-containing semiconductor polycrystalline material as compared to dielectric. One type of anisotropic etching process that can be employed in the present invention in forming the structure shown in FIG. 1A is a reactive-ion etching (RIE) process wherein a halogen-containing plasma is used as the etchant gas. It should be noted that during this etching step of the present invention some or all of gate dielectric 12 surrounding patterned polysilicon 14 may be removed.

Note that the structure shown in FIG. 1A is a transistor structure having a gate region that is comprised of a patterned region of Si-containing semiconductor polycrystalline material 14. The transistor structure also includes gate dielectric 12 and substrate 10. Note that when a dielectric cap is employed, the structure would look similar to the one depicted in FIG. 1A except that a patterned dielectric cap would be present on the patterned region of Si-containing semiconductor polycrystalline material.

Figure 1B:
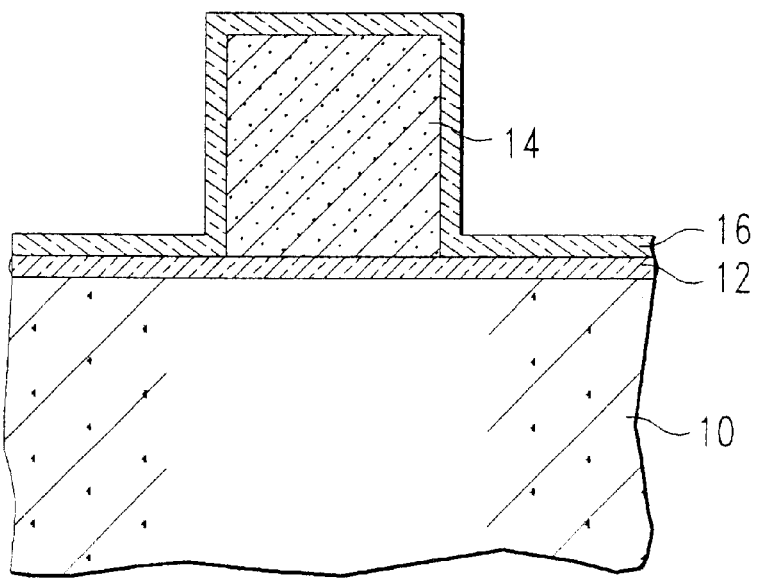

In accordance with the next step of the present invention, the structure shown in FIG. 1A is then exposed to a sidewall oxidation process that is capable of forming thermal oxide layer 16 on top of substrate 10 (or remaining gate dielectric 12) and/or on the exposed walls of patterned Si-containing semicoductor polycrystalline region 14. The resultant structure containing thermal oxide layer 16 formed on the sidewalls and top surface of Si-containing semiconductor polycrystalline region 14 is shown, for example, in FIG. 1B.

The conditions used in forming oxide layer 16 may vary depending upon the exact sidewall oxidation process performed. Typically, however, the sidewall oxidation is carried out at a temperature of from about 800° C. to about 1100° C. for a time period of from about 10 seconds to about 2 hours in dry $O_2$. It should be noted that the polysilicon grain size increases significantly due to the high thermal budget of a typical sidewall oxidation process.

Notwithstanding the conditions employed, the sidewall oxidation step of the present invention is carried out in an oxidizing ambient that comprises atomic oxygen. Atomic oxygen radicals can oxidize silicon surfaces at a low temperature with a high rate. Accordingly, the growth of polysilicon grains is substantially suppressed.

Atomic oxygen can be formed by utilizing a free-radical enhanced rapid thermal oxidation (FRE RTO) process, by employing remote formation of gaseous discharges (plasma) in oxygen-bearing gases, or by decomposing unstable oxygen-bearing gases such as ozone.

In a preferred embodiment, the FRE RTO process is employed to form the sidewall oxide. In the process, hydrogen and oxygen are introduced into a process chamber and held at a low pressure of between about 50 Torr and about 0.1 Torr. The oxygen and hydrogen react in the volume of the chamber and at the chamber and at the surface of the silicon substrate producing highly reactive oxygen radicals that rapidly oxidize silicon. Due to the low chamber pressure the volume recombination of atomic oxygen is very low resulting in the accumulation of atomic oxygen. The FRE RTO process is also known in the art under the name of an In-Situ Steam Generation (ISSG) process. The preferred conditions of the FRE RTO process are chamber pressure of about 10 Torr, substrate temperature of from about 500° C. to about 900° C., and processing gas composition of about 33% $H_2$ and about 67% $O_2$.

In another preferred embodiment, the plasma-assisted oxidation is employed to form the sidewall oxide. In the process, a remote gaseous discharge is used to crack oxygen-bearing molecules. At a low pressure, the atomic oxygen produced in the discharge zone can be transported to the processing zone almost without loss. This is again due to a very low volume recombination of atomic oxygen at low pressures. Accordingly, the process is conducted at a low chamber pressure of below about 50 Torr. The preferred pressure range of the discharge zone is from about 1 mTorr to about 10 Torr. In order to establish a gas flow between the discharge and processing zone, the pressure of the discharge zone is generally higher than that of the processing zone. In an extreme case, the processing zone can be an MBE-type reactor with ambient pressure of below about 0.5 mTorr. The process can be conducted at the substrate temperature of from about room-temperature (e.g., 25° C.) to about 1100° C.

The physical thickness of the resultant thermal oxide layer formed by the sidewall oxidation step of the present invention may vary depending on the exact conditions employed. Typically, however, thermal oxide layer 16 has a thickness of from about 1 to about 20 nm, with a thickness of from about 2 to about 10 nm being more highly preferred.

It is emphasized that the sidewall oxidation process of the present invention (which includes atomic oxygen as the oxidative ambient) significantly lowers the thermal budget of the process such that it prevents the formation of large grain sizes in the gate conductor. Moreover, the polycrystalline grain size of the gate conductor region after oxidation is substantially the same as prior to oxidation. Thus, the inventive sidewall oxidation process mentioned above represents an improvement over conventional sidewall oxidation processes that do not employ atomic oxygen as the oxidative species.

Following the gate sidewall oxidation process, dopant ions 18 are implanted into substrate 10 as well as patterned Si-containing semiconductor polycrystalline region 14 by a conventional ion implantation process well known in the art. The dopant ions employed during this implant step may be of the n- or p-type depending on the desired device to be formed. The structure during the implantation process is shown, for example, in FIG. 1C. Note that the ion dose and energy used for this implant may vary depending on the type of ion being implanted.

Figure 1C:
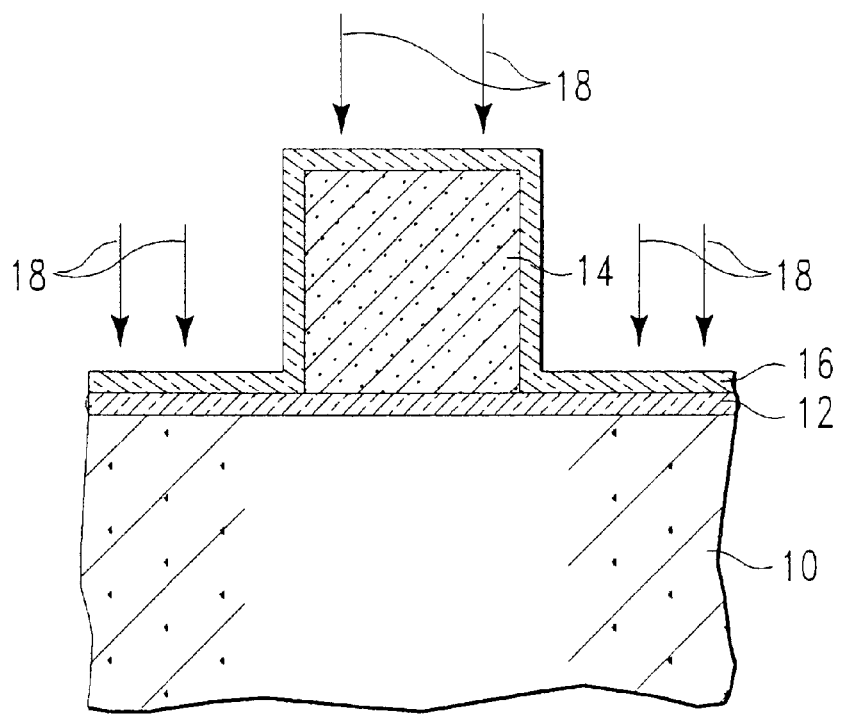
Figure 1D:
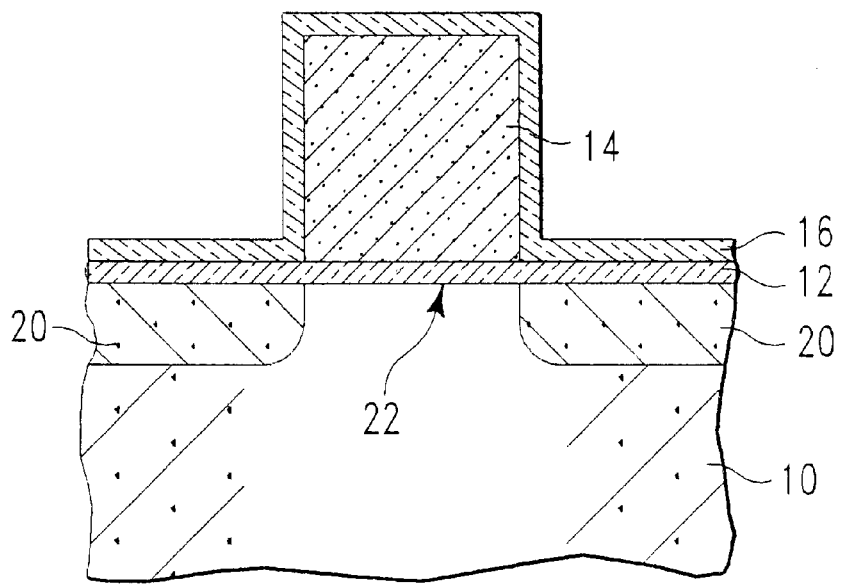

Following ion implantation, the structure shown in FIG. 1C is subjected to an activation-annealing step which forms diffusion regions 20 (i.e., source/drain regions) beneath the patterned Si-containing semiconductor polycrystalline region which is now doped. The channel region of the transistor, which is labeled as 22 in the drawings, provides electrical connection between the diffusion regions.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention is not limited to the exact forms and details described and illustrated, but fall within the scope of the appended claims.

Having thus described our invention in detail, what we claim as new and desire to secure by the Letters Patent is:

1. A method of forming a Si-based metal-insulator-semiconductor (MIS) transistor comprising the steps of:
   (a) forming a structure comprising a patterned Si-containing semiconductor polycrystalline region with grains of less than about 0.1 $\mu$m on a surface of a gate dielectric, said structure is formed by the steps of: forming said gate dielectric on a surface of a Si-containing substrate; forming a layer of Si-containing semiconductor polycrystalline material on said gate dielectric; applying a resist to said layer of Si-containing semiconductor polycrystalline material; exposing said resist to a pattern of radiation; developing the pattern in said resist; and transfering said pattern to said Si-containing semiconductor polycrystalline material via an etching step;
   (b) subjecting said structure to a sidewall oxidation process in which atomic oxygen is employed so as to oxidize a portion of said Si-containing semiconductor polycrystalline region;
   (c) implanting dopant ions into said Si-containing substrate and said Si-containing semiconductor polycrystalline region; and
   (d) activating said dopant ions.

2. The method of claim 1 wherein said gate dielectric is formed by a deposition process or by a thermal growing process.

3. The method of claim 1 wherein said layer of Si-containing semiconductor polycrystalline material is formed by a deposition process or by an epitaxial growth process.

4. The method of claim 1 wherein said atomic oxygen is formed by a free radical enhanced rapid thermal oxidation process, by an oxygen plasma, or by decomposing unstable oxygen-bearing gases.

5. The method of claim 1 wherein step (b) is performed so as to substantially suppress polycrystalline grain growth.

6. The method of claim 4 wherein said free-radical enhanced rapid thermal oxidation process is carried out in oxygen and hydrogen and at a pressure of about from 0.1 to about 50 Torr.

7. The method of claim 6 wherein said free-radical enhanced rapid thermal oxidation process is carried out at a substrate temperature of from about 500° to about 900° C. in about 67% oxygen and about 33% hydrogen and at a pressure of about 10 Torr.

8. The method of claim 4 wherein said oxygen plasma is formed from a remote gaseous discharge in an oxygen-bearing gas.

9. The method of claim 8 wherein said oxygen plasma is formed at a pressure of below about 50 Torr.

10. The method of claim 8 wherein said oxygen plasma is formed at a substrate temperature of from about room temperature to about 1100° C.

11. The method of claim 1 wherein said Si-containing semiconductor polycrystalline material comprises polysilicon, SiGe, SiC, SiGeC or Si/SiGe.

12. The method of claim 11 wherein said Si-containing semiconductor polycrystalline material is polysilicon.

13. A Si-based MIS transistor comprising:
   a Si-containing substrate;
   a gate dielectric located atop a surface of said Si-containing substrate;
   a patterned gate conductor region of implanted Si-containing semiconductor polycrystalline material located atop a surface of said gate dielectric, wherein said region of implanted Si-containing polycrystalline material has grain sizes of about 0.1 $\mu$m or less and minimized poly depletion;
   a layer of thermal oxide located atop at least sidewalls of said patterned region of Si-containing semiconductor polycrystalline material; and
   diffusion regions located in said Si-containing substrate about said patterned region of Si-containing semiconductor polycrystalline material, wherein said diffusion regions are in electrical contact with each other via a channel region.

14. The Si-based MIS transistor of claim 13 wherein said Si-containing substrate comprises a Si-containing semiconducting material selected from the group consisting of Si, SiGe, SiGeC, Si/Si, Si/SiGe and silicon-on-insulators.

15. The Si-based MIS transistor of claim 13 wherein said gate dielectric is an oxide, a nitride, an oxynitride, or mixtures and multilayers thereof.

16. The Si-based MIS transistor of claim 13 wherein said thermal oxide has a thickness of from about 1 to about 20 nm.

17. The Si-based MIS transistor of claim 16 wherein said thermal oxide has a thickness of from about 2 to about 10 nm.

18. The Si-based MIS transistor of claim 13 wherein said thermal oxide is comprised of atomic oxygen.

19. The Si-based MIS transistor of claim 13 wherein said Si-containing semiconductor polycrystalline material comprises polysilicon, SiGe, SiC, SiGeC, or Si/SiGe.

20. The Si-based MIS transistor of claim 19 wherein said Si-containing semiconductor polycrystalline material comprises polysilicon.

* * * * *

UNITED STATES PATENT AND TRADEMARK OFFICE
CERTIFICATE OF CORRECTION

PATENT NO.    : 6,566,210 B2
DATED         : May 20, 2003
INVENTOR(S)   : Atul C. Ajmera et al.

It is certified that error appears in the above-identified patent and that said Letters Patent is hereby corrected as shown below:

Column 1,
Lines 28, 29, 30, 31, 32, 34 and 37, "corners" should read -- corner --

Column 2,
Line 33, "Sibased" should read -- Si-based --
Line 58, "a surface" should read -- on a surface --

Signed and Sealed this

Seventh Day of October, 2003

JAMES E. ROGAN
*Director of the United States Patent and Trademark Office*